Oct. 1, 1968 D. H. MASH 3,404,320
VARACTOR DIODE WITH MEANS FOR CHANGING VOLTAGE-TO-CAPACITANCE RATIO
Filed April 13, 1966
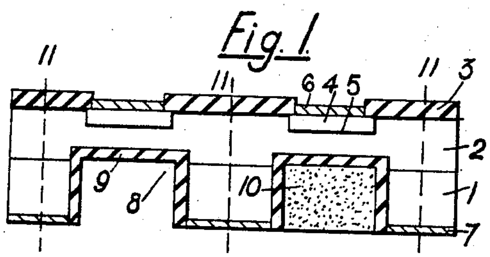
Fig. 1
Fig. 2
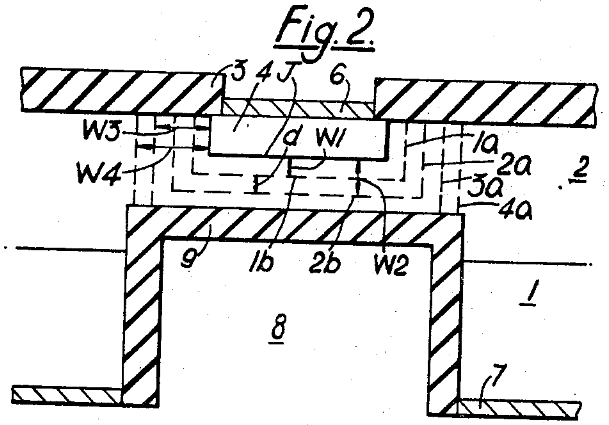
Fig. 3
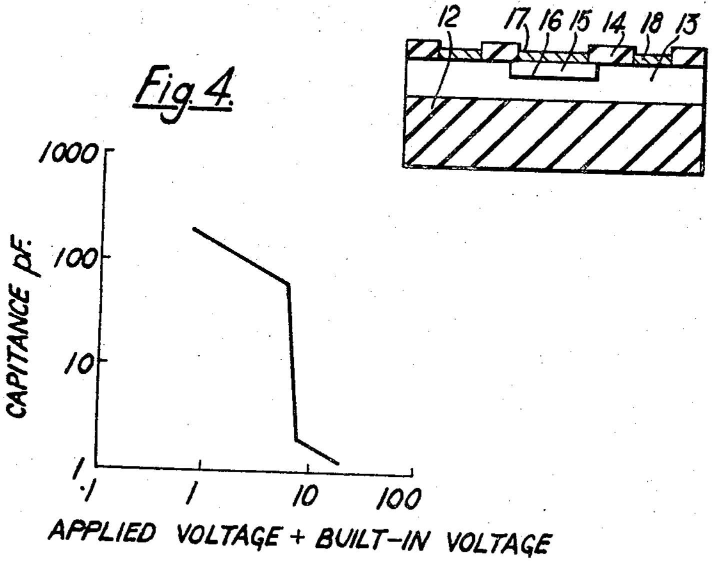
Fig. 4
Inventor
DEREK H. MASH
By Philip M. Bolton
Attorney 3,404,320

VARACTOR DIODE WITH MEANS FOR CHANGING VOLTAGE-TO-CAPACITANCE RATIO

Derek Hubert Mash, Harlow, England, assignor to International Standard Electric Corporation, New York, N.Y., a corporation of Delaware Filed Apr. 13, 1966, Ser. No. 542,287
Claims priority, application Great Britain, May 20, 1965, 21,344/65
13 Claims. (Cl. 317—234)

ABSTRACT OF THE DISCLOSURE

A varactor diode has a p-n junction disposed in a portion of a semiconductor body having a relatively high conductivity. A region of a relatively low conductivity is spaced from the p-n junction but within the expansion reach of the depletion layer boundary upon a predetermined reverse voltage value. At this voltage level the capacitance to voltage ratio changes.

This invention relates to varactor diodes.

Varacter diodes are extensively used in parametric amplifiers, harmonic generators and other circuits, and for variable capacitors. The important characteristic of these devices is that the capacity of the junction varies with applied voltage. This effect is achieved by virtue of the expansion of the junction depletion layer, or of the depletion layer at a metal-semiconductor barrier, under reverse applied voltage. At an abrupt junction, the expansion of the depletion layer results in a capacity C changing inversely with the square root of the applied voltage V. At a graded junction C varies inversely with $V^{1/3}$. These changes can be used for harmonic generation, but the small and graded dependence of capacity on voltage is not ideal for the purpose. In conventional varactors the capacity change arises from the expansion of the depletion layer, while its area remains constant.

An object of the present invention is to obtain a change in both width and area of the depletion layer with voltage, resulting in a sensitive and controlled variation of capacity with voltage.

According to the invention there is provided a varactor diode including a junction between a first region of metal or semiconductor material and a second region of semiconductor material of higher resistivity than said first region, said second region being of larger area than and surrounding said junction, and opposite to said junction an interface between said second region and an insulating region, said interface being spaced from said junction at a distance such that with increasing reverse bias of said junction the boundary of a depletion layer extending from said junction into said second region initially spreads through said second region both sideways and towards said interface until the boundary reaches said interface whereupon the boundary continues to spread only sideways into said second region.

Two embodiments of the invention will now be described with reference to the accompanying drawings, in which:

FIG. 1 is a sectioned elevation of a pair of varactor diodes according to a first embodiment of the invention, FIG. 2 is an enlarged view of one of the diodes of FIG. 1 for explaining the operation thereof, FIG. 3 is a sectioned elevation of a varactor diode according to a second embodiment of the invention, and FIG. 4 shows capacitance/bias voltage characteristics of a varactor diode embodying the invention.

Referring to FIG. 1, a slice 1 of heavily doped n-type silicon, i.e. $n^+$-type silicon, onto which a thin layer 2 of lightly doped n-type silicon has been grown epitaxially, is provided with a layer 3 of silica to act as a mask against diffusion of impurities. "Windows" are etched in the silica layer 3 by well-known techniques and a p-type silicon layer 4 is formed by diffusion through these areas, resulting in "planar" p-n junctions 5. Ohmic contacts 6 and 7 are then applied to the p and $n^+$ layers 4 and 1 respectively.

Cylindrical holes 8 are made through the $n^+$ region and part way through the n-region 2, by air-abrasion, spark-machining, or other methods. These holes may be made before or after the diffusion process. The dimensions of the hole should be a little larger than the diffused p-region, but this may be adjusted depending on the required characteristics. The inner surface of the hole may be provided with a passivating layer 9 of $SiO_2$ or other material, or of p-type semiconductor material and the hole may be finally filled with a setting plastic or other insulating material 10 to increase the mechanical rigidity of the final device, as shown in the right-hand diode of FIG. 1. Individual diodes are separated by cutting or breaking at the dashed lines 11, and subsequently mounting.

The mechanism of operation can be seen with reference to the enlarged cross-section of FIG. 2. The p-n junction is the full line marked J. The dashed lines 1*a* and 1*b* represents the boundary of the depletion layer in the n-region 2 with zero applied voltage. The other boundary of the depletion layer is slightly within the p-region 4. On application of a reverse bias across the junction, the depletion layer extends further into the n- and p-regions. The extent of this movement *d* depends on the respective resistivities of these layers. The resistivity of the n-region is relatively high and the movement *d* from $W_1$ to $W_2$ is relatively large, while the p-layer is of low resistivity and hence the movement into it is small and will hereafter be ignored. The capacity of the junction is now determined by the depletion layer area. composed of the parts labelled 2*a* and 2*b*, and its width $W_2$. Further increase of the reverse bias eventually leads to the position shown by the dashed line 3*a*. Here all the charge carriers which were previously between the area of 2*b* and the edge of the hole have been drawn to each side, and the capacity now is determined by the area 3*a* only of the depletion layer and its width $W_3$. This area is much less than the previous area 2*a*+2*b*, and so the capacity drops abruptly. Further increase of bias will result in a small drop of capacity as the depletion layer widens further to $W_4$ at 4*a*.

To obtain a sharp variation of capacitance with voltage, the bottom of the hole 8 should be flat or convex. More gradual voltage-capacitance relationships can be obtained by concave, stepped or inclined shaping of the bottom of the hole.

The contact 7 may be made to the n-type region 2 instead of the $n^+$-type region 1, for example in the form of an annulus surrounding the contact 6 to the p-type layer 4.

The above example can be examined quantitatively. If the n-type layer 2 has a resistivity of 2 ohm cm. and a thickness of $20\mu$ above the $n^+$ layer 1 which has a thickness of about $200\mu$ (0.008 inch), and the p-type layer 4 has an area of 1 mm.$^2$ and a depth of $6\mu$, the depletion layer width at zero applied voltage is $0.6\mu$ and the junction capacitance is about 180 pf. When 6 volts is applied, the depletion layer extends almost to surface of the hole and the capacitance is 58 pF. At 7.5 volts the depletion layer reaches the bottom of the hole and the charge-carriers withdraw to each side of it. The junction capacitance now falls to a much smaller value, about 2 pf., and thereafter with increasing voltage falls slowly. The theoretical characteristic is as shown in FIG. 4, on a log-log graph.

In the second embodiment shown in FIG. 3, a semi-insulating slice 12 of gallium arsenide on to which a thin layer 13 of n-type gallium arsenide has been epitaxially deposited, is provided with a layer 14 of silica to act as a protective mask. A central window is etched in the silica layer 14, and a p-type gallium arsenide layer 15 is formed by diffusion through this window resulting in a planar p-n junction 16.

An ohmic contact 17 is then applied to the p-type region 15, and an annular ohmic contact 18 is applied to the n-type region 13 through an annular window in the silica layer 14.

On application of a reverse bias across the junction 16, the depletion layer extends further into the n- and p-regions. As in the first embodiment, the n-type region is of higher resistivity than the p-type layer and consideration will be made only of the movement of the depletion layer in the n-type region. With increasing reverse bias the depletion layer boundary reaches the boundary face of the n-type region 13 contiguous with the semi-insulating substrate 12. All the charge carriers which were previously between the boundary of the expanding depletion layer and the boundary face of the n-type region are now drawn to each side, and with the reduction in area of the boundary of the depletion layer, the capacity drops abruptly.

The interface between the substrate 12 and the layer 13 may be shaped in a variety of ways, as described for the first embodiment, according to the desired variation of capacitance with voltage.

In both embodiments, other suitable semiconductor materials may be used, to provide the conducting substrate of the first embodiment and the semi-insulating or insulating substrate of the second embodiment, and the layers subsequently laid down on the substrate.

Instead of a low resistivity p-type layer contacting a higher resistivity n-type layer, the conductivity types may be reversed with a corresponding reversal of conductivity type of the conducting substrate. A metal layer may replace the lower resisitivity semiconductor material to give a metal semiconductor junction.

It is to be understood that the foregoing description of specific examples of this invention is made by way of example only and is not to be considered as a limitation on its scope.

What I claim is:

1. A varactor diode exhibiting a relative change in capacitance at a predetermined value of applied reverse voltage, comprising:
- a body of semiconductor material including a barrier layer having an associated expandable depletion layer responsive to application of reverse voltage;
- at least one electrode contacting said body on each respective side of said barrier layer; and
- said body comprising a low conductivity region spaced from said barrier layer and within the expansion distance of a boundary portion of said depletion layer at a reverse voltage equal to said predetermined value, thereby effectively changing the increase in area of said boundary at reverse voltages equal to or greater than said predetermined value.

2. A diode according to claim 1, wherein said barrier layer comprises a p-n junction between first and second regions of opposite conductivity type within said semiconductor body, said second region containing said boundary portion.

3. A diode according to claim 2, wherein the electrode contacting said second region is spaced from said p-n junction a distance greater than said boundary expansion upon applied voltage.

4. A diode according to claim 2, wherein said first region is inset into said second region.

5. A diode according to claim 4, wherein at least a portion of the interface between said second region and said low conductivity region is substantially parallel to said p-n junction.

6. A diode according to claim 2, wherein the resistivity of said second region is substantially greater than the resistivity of said first region.

7. A diode according to claim 3, wherein the interface between said second region and said low conductivity region is convex.

8. A diode according to claim 6, wherein the interface between said second region and said low conductivity is concave.

9. A diode according to claim 6, wherein the interface between said second region and said low conductivity region is stepped such that, each step being a different distance from said p-n junction.

10. A diode according to claim 1, wherein said low conductivity region comprises insulating material.

11. A diode according to claim 10, wherein at least a portion of said insulating material occupies a recess in said body.

12. A diode according to claim 11, wherein said insulating material comprises a dielectric layer on the bottom of said recess.

13. A diode according to claim 11, wherein said recess is filled with an insulating substance and increases the mechanical rigidity of said body.

References Cited

UNITED STATES PATENTS

| | | | |
|---|---|---|---|
| 2,964,648 | 12/1960 | Daucette et al. | 317—234 |
| 2,989,650 | 6/1961 | Daucette et al. | 317—234 |
| 2,991,371 | 7/1961 | Lehovec | 317—234 |

JAMES D. KALLAM, *Primary Examiner.*